United States Patent
Sakurai et al.

(10) Patent No.: US 8,617,969 B2
(45) Date of Patent: Dec. 31, 2013

(54) METHOD FOR PRODUCING SEMICONDUCTOR OPTICAL DEVICE

(75) Inventors: Kenji Sakurai, Yokohama (JP); Hideki Yagi, Yokohama (JP); Hiroyuki Yoshinaga, Yokohama (JP)

(73) Assignee: Sumitomo Electric Industries Ltd., Osaka (JP)

( * ) Notice: Subject to any disclaimer, the term of this patent is extended or adjusted under 35 U.S.C. 154(b) by 0 days.

(21) Appl. No.: 13/530,154

(22) Filed: Jun. 22, 2012

(65) Prior Publication Data
US 2013/0012001 A1  Jan. 10, 2013

(30) Foreign Application Priority Data
Jul. 4, 2011  (JP) .................. 2011-148500

(51) Int. Cl.
*H01L 21/00* (2006.01)

(52) U.S. Cl.
USPC .............................. 438/478; 438/745; 216/41

(58) Field of Classification Search
USPC .................... 438/478, 745; 216/41
See application file for complete search history.

(56) References Cited

U.S. PATENT DOCUMENTS

| 6,855,647 | B2 * | 2/2005 | Beck et al. .................... 438/795 |
| 8,038,893 | B2 * | 10/2011 | Nomaguchi .................... 216/41 |
| 8,308,964 | B2 * | 11/2012 | Xu et al. ........................ 216/22 |
| 2004/0195688 | A1 * | 10/2004 | Beck et al. .................... 257/751 |
| 2005/0026427 | A1 * | 2/2005 | Beck et al. .................... 438/666 |
| 2005/0186800 | A1 * | 8/2005 | Brewer ........................ 438/694 |
| 2009/0181522 | A1 * | 7/2009 | Nomaguchi .................. 438/478 |
| 2010/0323917 | A1 * | 12/2010 | Vertes et al. .................... 506/12 |
| 2011/0174774 | A1 * | 7/2011 | Lin et al. ........................ 216/41 |
| 2013/0012001 | A1 * | 1/2013 | Sakurai et al. ................ 438/478 |

FOREIGN PATENT DOCUMENTS

JP  2008-300650  12/2008

* cited by examiner

*Primary Examiner* — Laura Menz
(74) *Attorney, Agent, or Firm* — Smith, Gambrell & Russell, LLP

(57) ABSTRACT

A method for producing a semiconductor optical device includes the steps of growing a semiconductor stacked layer including an etch stop layer and a plurality of semiconductor layers on a major surface of a substrate; forming a mask layer on a top surface of the semiconductor stacked layer so that a tip portion of each of protrusions that protrude from the top surface among protrusions generated in the step of growing the semiconductor stacked layer is exposed; etching the protrusion by wet etching using the mask layer; after etching the protrusion by wet etching, removing the protrusion by dry etching; and removing the mask layer from the top surface, after removing the protrusion by dry etching.

8 Claims, 7 Drawing Sheets

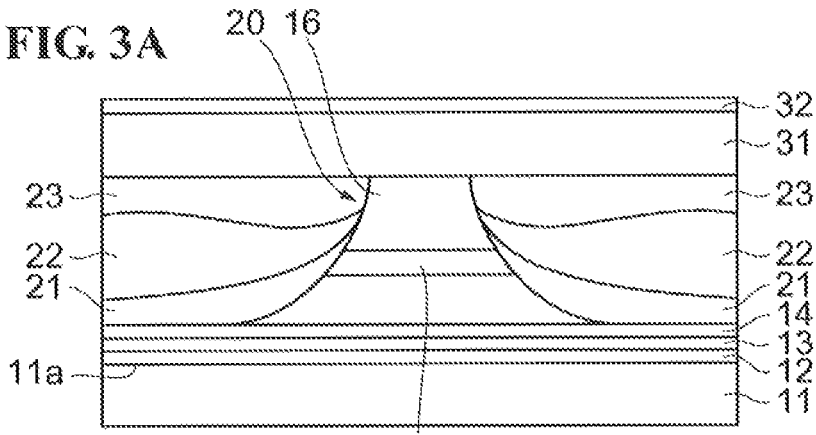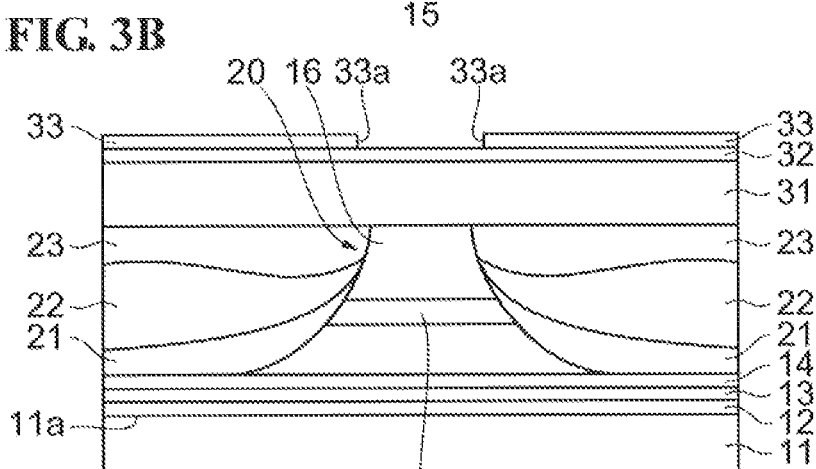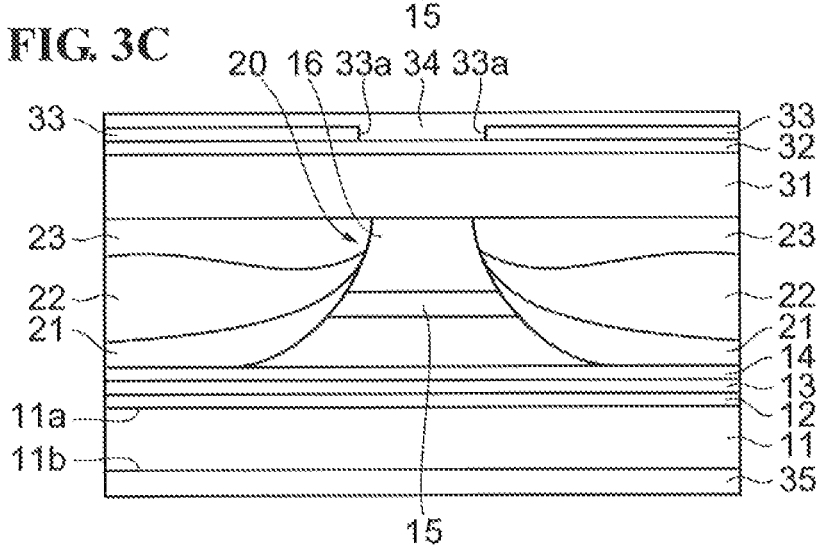

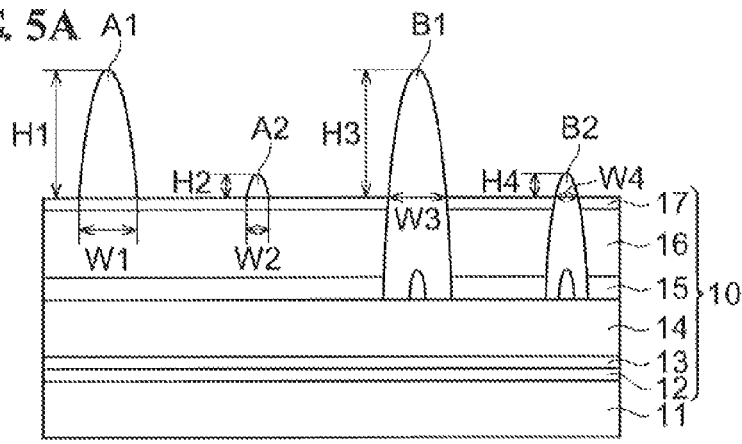
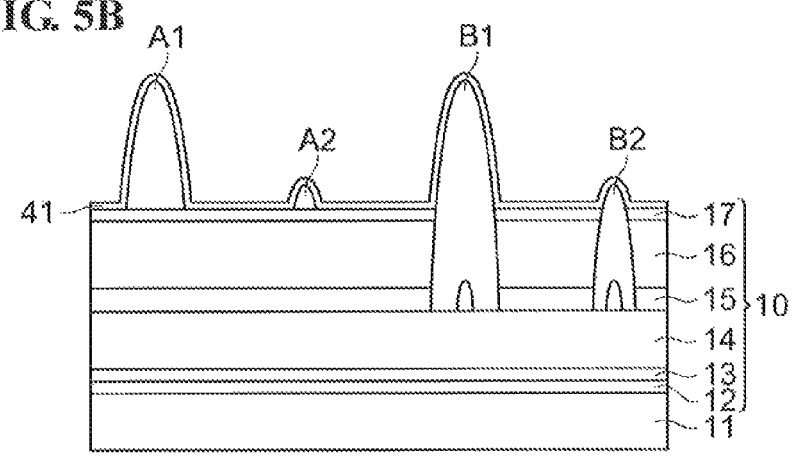
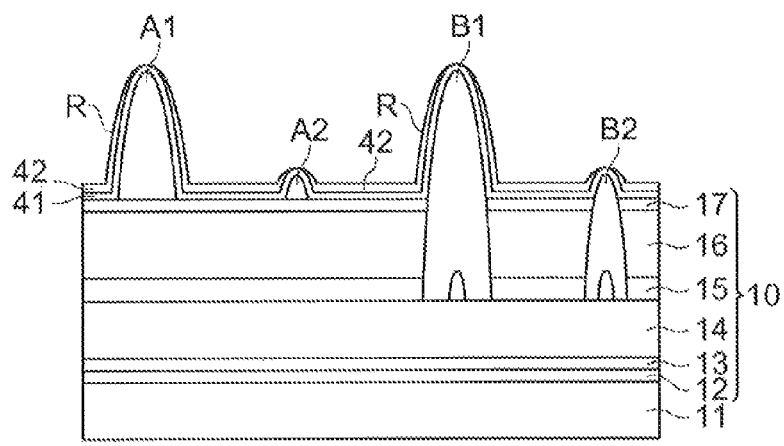

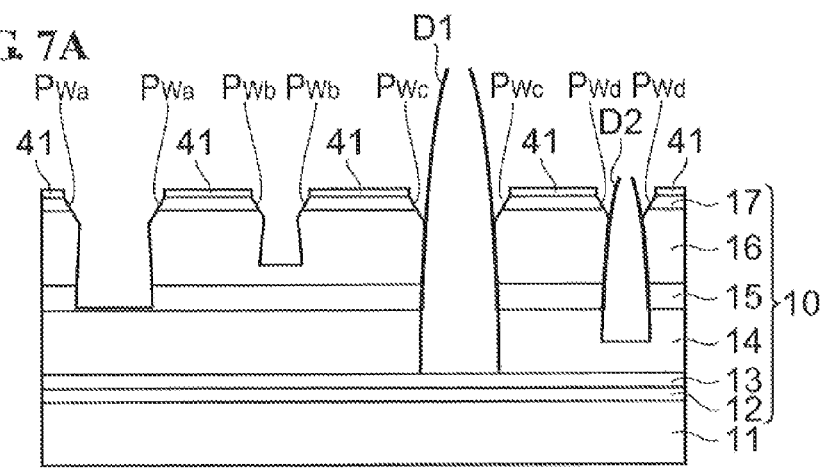
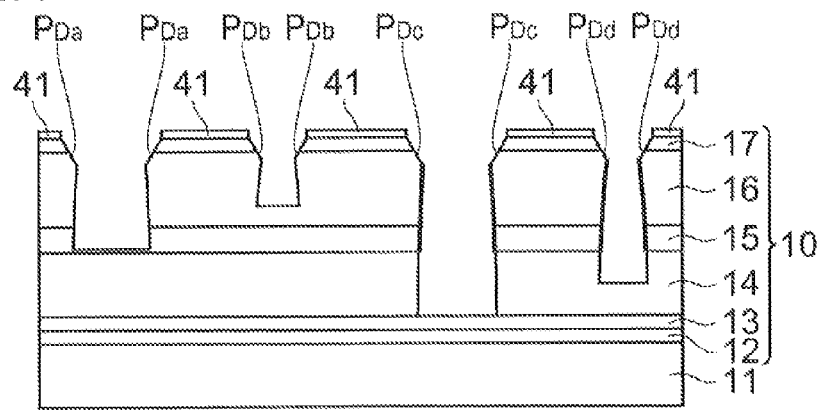
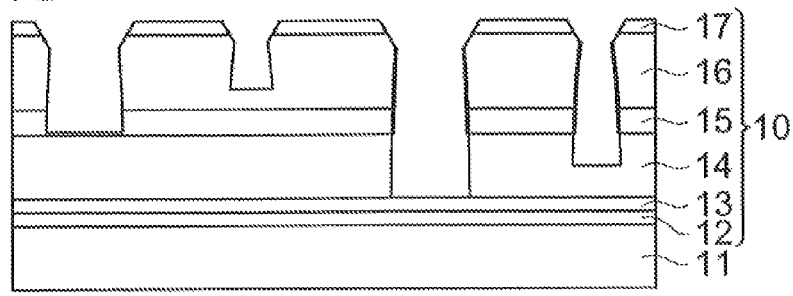

METHOD FOR PRODUCING SEMICONDUCTOR OPTICAL DEVICE

BACKGROUND OF THE INVENTION

1. Field of the Invention

The present invention relates to a method for producing a semiconductor optical device.

2. Description of the Related Art

Crystal growth methods such as a metal organic chemical vapor deposition (MOCVD) method have been widely used to form each of semiconductor layers constituting a semiconductor optical device. When a semiconductor layer is formed by such a crystal growth method, an unwanted by-product or the like is generated on an inner wall of a crystal growth chamber and such a by-product is sometimes attached to the surface of the semiconductor layer. The by-product attached to the surface of the semiconductor layer may generate protrusions on the surface of the semiconductor layer. In a method for producing a semiconductor optical device disclosed in Japanese Unexamined Patent Application Publication No. 2008-300650 (hereinafter referred to as "Patent Document 1"), an insulating layer is formed on the surface of a semiconductor layer and a resist is applied thereon. Subsequently, protrusions are exposed through a self-aligning process and removed by wet etching.

SUMMARY OF THE INVENTION

When protrusions are present on the surface of a semiconductor layer, an irregular pattern is formed due to projections and depressions of the surface during lithography. Furthermore, the protrusions are in contact with a photo mask used in lithography, which causes the breakage of a semiconductor substrate and the introduction of cracking. In addition, a semiconductor surface is contaminated because of crushing of the protrusions. In the method for producing a semiconductor optical device disclosed in Patent Document 1, when protrusions are removed by wet etching, etching may be performed to an excessively deep position. In this case, a resist may be unevenly applied and patterning defects may be caused in a step performed later. It has also been found from experiment that such protrusions contain a component that cannot be solved with an etchant disclosed in Patent Document 1. In such a case, the protrusions cannot be removed by wet etching, and hollow protrusions are left after the wet etching.

A method for producing a semiconductor optical device according to the present invention includes the steps of (a) growing a semiconductor stacked layer including an etch stop layer and a plurality of semiconductor layers on a major surface of a substrate; (b) forming a mask layer on a top surface of the semiconductor stacked layer so that a tip portion of each of protrusions that protrude from the top surface among protrusions generated in the step of growing the semiconductor stacked layer is exposed; (c) etching the protrusion by wet etching using the mask layer; (d) after etching the protrusion by wet etching, removing the protrusion by dry etching; and (e) removing the mask layer from the top surface, after removing the protrusion by dry etching.

According to the method for producing a semiconductor optical device, the protrusion is removed by performing both wet etching and dry etching. Therefore, even if hollow protrusions are left after the wet etching, they can be removed by dry etching. In addition, since the etch stop layer is formed, the progress of the wet etching and dry etching can be suppressed in the etch stop layer, which can suppress an excessive amount of etching.

In the method for producing a semiconductor optical device according to the present invention, the step of forming the mask layer preferably includes the steps of forming an insulating layer on the tip portion and a side surface of the protrusion and on the top surface of the semiconductor stacked layer; forming a resist layer by applying a resist on the insulating layer so that the tip portion of the protrusion is exposed; and selectively removing the insulating layer from the tip portion and side surface of the protrusion using the resist layer. In addition, the step of forming the mask layer may further include a step of descumming the resist formed on the tip portion and side surface of the protrusion, after forming the resist layer. In this case, the insulating layer on the tip portion and side surface of the protrusion is exposed more definitely. According to the method for producing a semiconductor optical device, the mask layer can be formed by selectively removing the insulating layer formed on the tip portion and side surface of the protrusion using the resist layer as a mask.

In the method for producing a semiconductor optical device according to the present invention, in the step of selectively removing the insulating layer, the insulating layer is preferably removed so that a size of an opening of the insulating layer is larger than a bottom size of the protrusion. According to the method for producing a semiconductor optical device, hollow protrusions left after the wet etching can be removed by dry etching together with the semiconductor layers around the hollow protrusions.

In the method for producing a semiconductor optical device according to the present invention, the etch stop layer is preferably composed of an Al-containing III-V group compound semiconductor material. The etching rate for the etch stop layer by dry etching (RIE) using a gas mixture containing, for example, a hydrocarbon and hydrogen is lower than the etching rate for other semiconductor layers. Therefore, the progress of the dry etching can be suppressed, which can suppress an excessive amount of etching.

In the method for producing a semiconductor optical device according to the present invention, in the step of etching the protrusion by wet etching, the wet etching is preferably performed using an etchant that is a mixture containing at least one of phosphoric acid, a hydrogen peroxide solution, hydrochloric acid, and acetic acid. According to the method for producing a semiconductor optical device, by using a mixture containing at least one of phosphoric acid, a hydrogen peroxide solution, hydrochloric acid, and acetic acid as an etchant for the wet etching, the inside of the protrusion can be removed with certainty.

In the method for producing a semiconductor optical device according to the present invention, in the step of removing the protrusion by dry etching, the dry etching is preferably performed by a reactive ion etching method using a gas mixture containing a hydrocarbon and hydrogen as an etching gas. In this dry etching, the etching rate for the etch stop layer is lower than the etching rate for other semiconductor layers. Therefore, the progress of the dry etching can be suppressed in the etch stop layer, which can suppress an excessive amount of etching.

In the method for producing a semiconductor optical device according to the present invention, the mask layer preferably has a thickness of 200 to 500 nm. According to the method for producing a semiconductor optical device, elimination of the insulating layer by dry etching can be suppressed and thus the etching of the semiconductor layers can be suppressed. Furthermore, an excessive amount of etching of the semiconductor layer around the protrusion, which is caused by excessively increasing the size of the opening of the insulating layer formed in the step of selectively removing the insulating layer, can be suppressed.

In the method for producing a semiconductor optical device according to the present invention, the etch stop layer preferably has a thickness of 100 to 500 nm. According to the method for producing a semiconductor optical device, a layer below the etch stop layer can be prevented from being etched.

BRIEF DESCRIPTION OF THE DRAWINGS

FIGS. 3A to 3C are diagrams showing the production process performed after the production process in FIGS. 2A to 2C.

FIGS. 5A to 5C are diagrams schematically showing the surface states of semiconductor layers in the surface treatment step of FIG. 4.

FIGS. 7A to 7C are diagrams schematically showing the surface states brought after the surface states of FIGS. 6A to 6C.

DESCRIPTION OF THE PREFERRED EMBODIMENT

Figure 1:
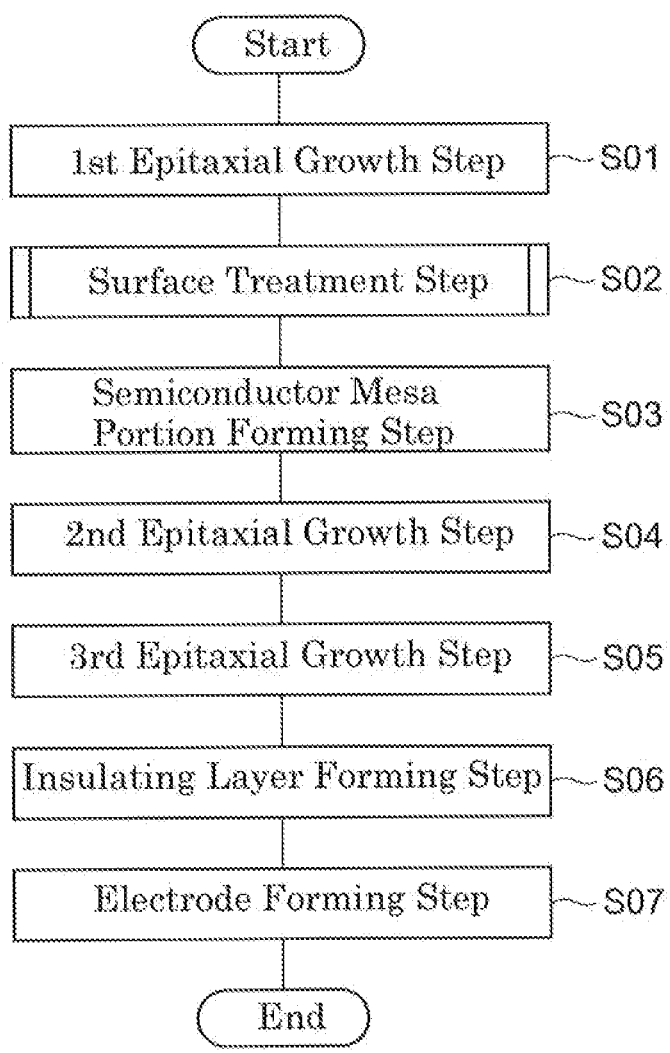
FIG. 1 is a flowchart showing a method for producing a semiconductor optical device according to this embodiment.

An embodiment of the present invention will now be described in detail with reference to the attached drawings. If possible, the same elements are denoted by the same reference numerals.

FIG. 1 is a flowchart showing a method for producing a semiconductor optical device according to this embodiment. FIGS. 2A to 3C are diagrams schematically showing the production process of the semiconductor optical device. As shown in FIG. 1, the method for producing a semiconductor optical device includes a first epitaxial growth step (semiconductor stacked layer-growing step) S01, a surface treatment step S02, a semiconductor mesa portion-forming step S03, a second epitaxial growth step S04, a third epitaxial growth step S05, an insulating layer-forming step S06, and an electrode-forming step S07.

Figure 2A:
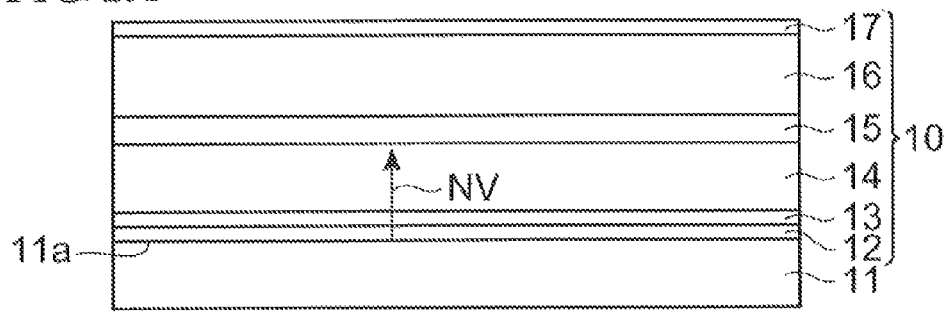
FIGS. 2A to 2C are diagrams showing the production process of the semiconductor optical device in the production method of FIG. 1.

In the first epitaxial growth step S01, as shown in FIG. 2A, a semiconductor stacked layer 10 is epitaxially grown on a major surface 11a of a semiconductor substrate 11 composed of n-type InP in a growth chamber. The semiconductor stacked layer 10 includes at least an etch stop layer 13, a lower cladding layer 14, an active layer 15, and an upper cladding layer 16. In this embodiment, the semiconductor stacked layer 10 includes a buffer layer 12 composed of n-type InP, an etch stop layer 13 composed of n-type AlInGaAs or AlInAsP, a lower cladding layer 14 composed of n-type InP, an active layer 15 composed of InGaAsP, an upper cladding layer 16 composed of p-type InP, and a capping layer 17 composed of p-type GaInAs. These semiconductor layers are stacked in that order in a direction of a normal axis NV of the major surface 11a. The epitaxial growth is performed by, for example, MOCVD. The etch stop layer 13 has a thickness of, for example, about 100 to 500 nm.

In the surface treatment step S02, the capping layer 17 is surface-treated. The capping layer 17 is a top layer of the semiconductor stacked layer 10 formed in the first epitaxial growth step S01. Although not shown in FIG. 2A, protrusions (flakes) formed due to Ga, In, As, and P and combined products thereof, which are attached to an inner wall of a growth chamber, may be generated on the surface of each of the semiconductor layers in the first epitaxial growth step S01. Furthermore, when a semiconductor layer is further stacked on the flakes, protrusions may be abnormally grown. In this abnormal growth, the flakes act as nuclei (refer to FIG. 5A). When protrusions are present on the surface of the semiconductor stacked layer 10, an irregular pattern is formed due to projections and depressions of the surface in a lithography process in the semiconductor mesa portion-forming step S03 described below. Furthermore, the protrusions are in contact with a photo mask used in lithography, which causes the breakage of a semiconductor substrate and the introduction of cracking. In addition, the surface of the semiconductor stacked layer 10 is contaminated because of scattering of crushed protrusions. Therefore, in the surface treatment step S02, protrusions generated on the lower cladding layer 14, active layer 15, upper cladding layer 16, and capping layer 17 are removed through surface treatment of the capping layer 17. The details of the surface treatment step S02 are described later.

Figure 2B:
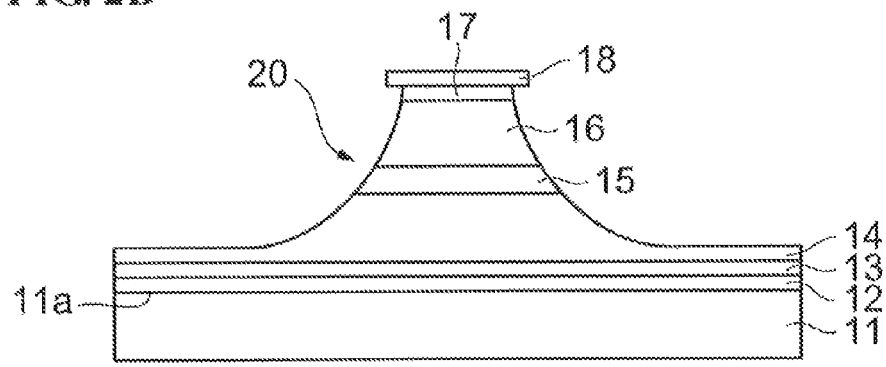

In the semiconductor mesa portion-forming step S03, an insulating layer 18 composed of a dielectric film such as a SiN or SiO$_2$ film is formed on the surface of the capping layer 17. Subsequently, the insulating layer 18 is processed by using lithography technique so as to have a striped shape having a width of about 3 μm. Wet etching with Br-methanol or the like is then performed using the stripe-shaped insulating layer 18 as a mask. Through this process, a semiconductor mesa portion 20 is formed as shown in FIG. 2B.

Figure 2C:
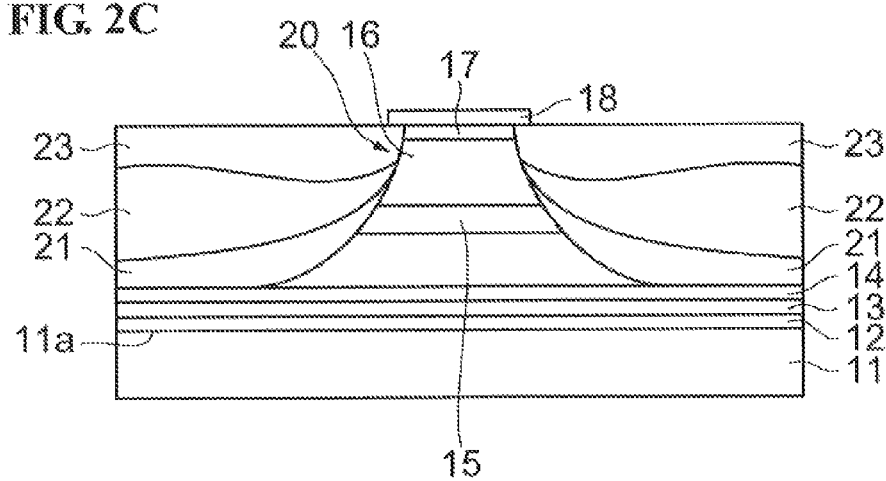

In the second epitaxial growth step S04, as shown in FIG. 2C, a first buried layer 21 composed of p-type InP, a second buried layer 22 composed of n-type InP, and a third buried layer 23 composed of p-type InP are formed in that order by, for example, MOCVD so as to cover the side surfaces of the semiconductor mesa portion 20 as a current blocking layer. The semiconductor mesa portion 20 is buried with the first, second and third buried layers 21, 22, and 23 to confine a current into the active layer in the semiconductor mesa portion 20.

In the third epitaxial growth step S05, as shown in FIG. 3A, a cladding layer 31 composed of p-type InP and a contact layer 32 composed of p-type InGaAs are formed in that order on the upper surfaces of the semiconductor mesa portion 20 and buried layer 23 by, for example, MOCVD.

In the insulating layer-forming step S06, an insulating layer 33 composed of a dielectric film such as a SiN or SiO$_2$ film is formed on the upper surface of the contact layer 32. A resist layer is then formed on the surface of the insulating layer 33. As shown in FIG. 3B, a striped opening 33a having a width of about 3 μm is formed in the insulating layer 33 using the resist layer as a mask. The upper surface of the contact layer 32 is exposed from the insulating layer 33 through the opening 33a.

In the electrode-forming step S07, as shown in FIG. 3C, an electrode 34 is formed in the opening 33a in direct contact with the contact layer 32. The electrode 34 is also formed on the insulating layer 33. The backside 11b of the semiconductor substrate 11 is polished, and then the electrode 35 is formed on a back surface of the semiconductor substrate 11.

The surface treatment step S02 will now be further described in detail.

Figure 4:
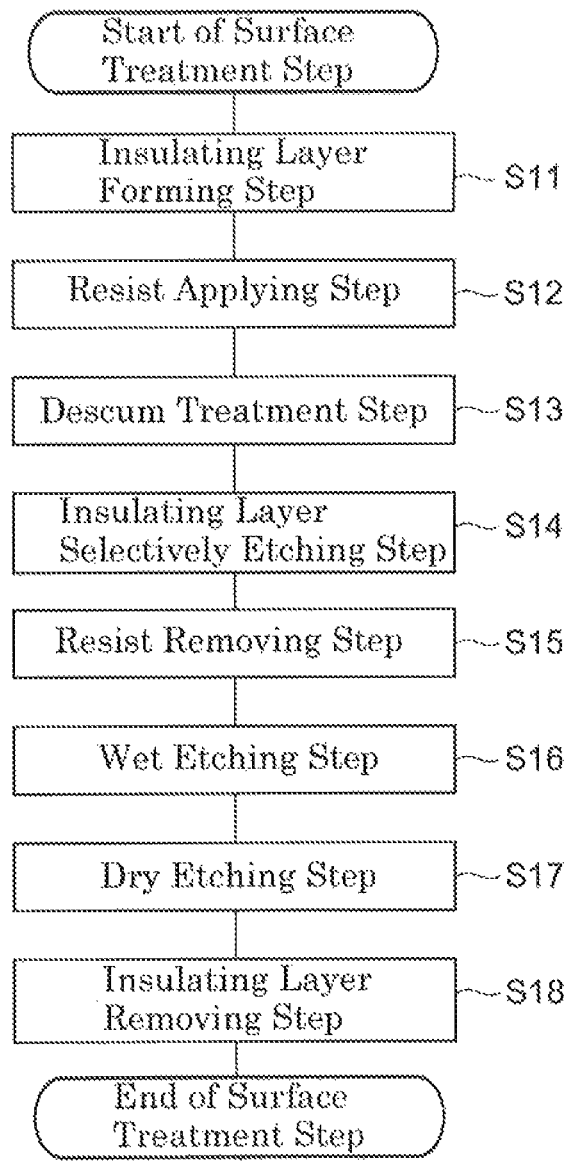
FIG. 4 is a flowchart showing the details of a surface treatment step.

FIG. 4 is a flowchart showing the details of the surface treatment step S02. FIGS. 5A to 7C are diagrams schematically showing the surface states of the semiconductor stacked layer in the surface treatment step S02. FIG. 5A is a diagram schematically showing the cross section of the semiconductor stacked layer 10 shown in FIG. 2A. As shown in FIG. 5A, a protrusion A1 and a protrusion A2 and a protrusion B1 and a protrusion B2 are present on the surface of the capping layer 17. The protrusion A1 and a protrusion A2 are protrusions attached to the surface of the capping layer 17. The protrusion B1 and a protrusion B2 are protrusions which are grown on flakes attached to the surface of the lower cladding layer 14 and protrude from the surface of the capping layer 17. In the growth of the protrusion B1 and the protrusion B2, the flakes act as nuclei in the epitaxial growth. The protrusions may be attached to not only the surfaces of the lower cladding layer 14 and capping layer 17 but also the surfaces of the active layer 15 and upper cladding layer 16. The heights H1 and H3 of the respective protrusion A1 and protrusion B1 from the surface of the capping layer 17 are, for example, 20 μm. The heights H2 and H4 of the respective protrusion A2 and protrusion B2 from the surface of the capping layer 17 are, for example, 3 μm. The heights of such protrusions from the surface of the capping layer 17 are about 1 to 30 μm. In FIGS. 5A to 7C, the protrusions on the surface of the capping layer 17 are schematically shown in the same cross section. However, in actual semiconductor optical devices, such protrusions are scattered on the capping layer 17 at a density of about 3/cm$^2$.

An insulating layer 41 is formed on the surfaces (tip portions and side surfaces) of the protrusions A1, A2, B1, and B2 and the surface of the capping layer 17 (insulating layer-forming step S11). The insulating layer 41 is composed of a dielectric film such as a SiN or SiO$_2$ film and has a thickness of, for example, 200 to 500 nm. Thus, as shown in FIG. 5B, the protrusions A1, A2, B1, and B2 are covered with the insulating layer 41.

Subsequently, for example, a novolac-based resist R is applied on the surface of the insulating layer 41 using a spin coater (resist-applying step S12). The resist R applied on the surface of the insulating layer 41 forms a resist layer 42 on the upper surface of the insulating layer 41. The resist layer 42 has a thickness of about 0.5 to 2 μm. Typically, the resist layer 42 has a thickness of about 1 μm. As shown in FIG. 5C, in the tip portions of the protrusions A2, B1, and B2 whose height is greater than the thickness of the resist layer 42, the thickness of the resist R is decreased. The tip portion of a protrusion is sometimes exposed from the resist R as in the case of the protrusion A1 whose height is greater than the thickness of the resist layer 42.

Figure 6A:
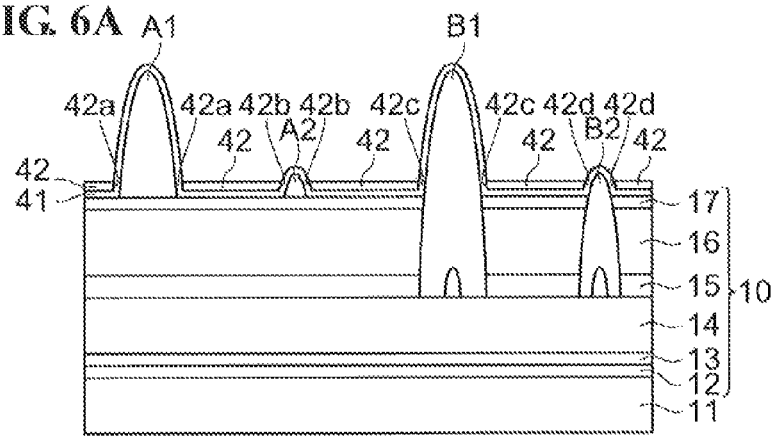
FIGS. 6A to 6C are diagrams schematically showing the surface states brought after the surface states of FIGS. 5A to 5C.

After the resist layer 42 is formed, a descum (O$_2$ ashing) treatment is performed using, for example, reactive ion etching (RIE) equipment (descum treatment step S13). The descum treatment is performed, for example, at an oxygen flow rate of 50 sccm at a pressure of 1 Pa at an RF power of 50 W. Thus, even when the resist R is slightly formed on the insulating layer 41 that is present on the tip portions and side surfaces of the protrusions A1, A2, B1, and B2, the resist R can be removed as shown in FIG. 6A. In this descum treatment step S13, the insulating layer 41 on the tip portions and side surfaces of the protrusions A1, A2, B1, and B2 is exposed more definitely. As a result, openings 42a, 42b, 42c, and 42d having substantially the same sizes as the bottom sizes W of the respective protrusions A1, A2, B1, and B2 are formed in the resist layer 42. Note that the term "bottom size W" of a protrusion means an area occupied by the protrusion on the surface of the capping layer 17. The thickness of the resist layer 42 can be finely adjusted through the descum treatment.

Figure 6B:
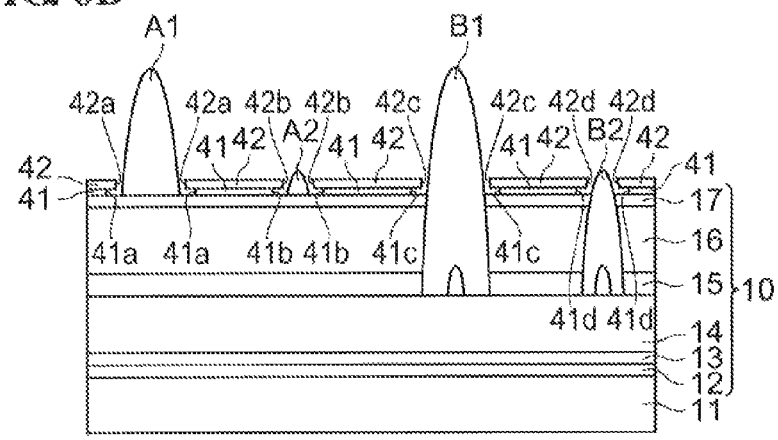

The insulating layer 41 is then selectively etched with hydrofluoric acid or the like using the resist layer 42 as a mask (insulating layer selectively etching step S14). Herein, the insulating layer 41 is etched to a portion between the resist layer 42 and the capping layer 17 so that the sizes of openings 41a, 41b, 41c, and 41d of the insulating layer 41 are larger than the bottom sizes of the protrusions A1, A2, B1, and B2, respectively. Furthermore, over-etching is performed with hydrofluoric acid or the like. Thus, an etching solution enters to a portion below the resist layer 42 in the periphery of each of the protrusions, which causes an undercut. Consequently, in the portion below the resist layer 42, etching proceeds from the periphery of the protrusion. Thus, as shown in FIG. 6B, portions of the insulating layer 41 formed on the tip portions and side surfaces of the protrusions A1, A2, B1, and B2 are etched, and the tip portions of the protrusions A1, A2, B1, and B2 are exposed.

Figure 6C:
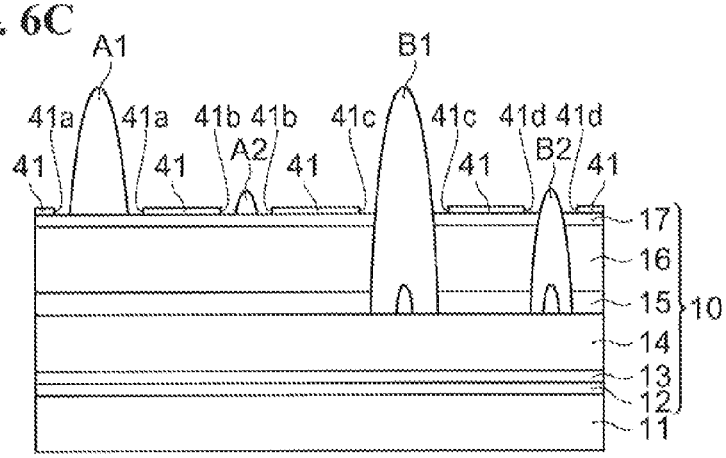

After the insulating layer 41 is selectively etched, the resist layer 42 on the insulating layer 41 is removed with an organic solvent such as acetone as shown in FIG. 6C (resist-removing step S15). Through the insulating layer-forming step S11 to the resist-removing step S15, a mask layer (insulating layer 41) is formed on the surface of the capping layer 17 so that the tip portions of the protrusions A1, A2, B1, and B2 that protrude from the surface of the capping layer 17 are exposed (mask layer-forming step).

Subsequently, the protrusions are wet-etched using the insulating layer 41 as a mask layer (wet etching step S16). An etchant having selectivity is used so that wet etching stops in the etch stop layer 13. Specific examples of the wet etching are shown below.

(S16-1) The protrusions are etched using a mixture (H$_3$PO$_4$:H$_2$O$_2$=5:1) of phosphoric acid and a hydrogen peroxide solution as the etchant. The mixture of phosphoric acid and a hydrogen peroxide solution selectively removes InGaAs but does not remove InP.

(S16-2) The protrusions are etched using a mixture (HCl:CH$_3$COOH=1:4) of hydrochloric acid and acetic acid as the etchant. The mixture of hydrochloric acid and acetic acid selectively removes InP but does not remove InGaAsP.

(S16-3) The protrusions are etched using a mixture (H$_3$PO$_4$:H$_2$O$_2$=5:1) of phosphoric acid and a hydrogen peroxide solution as the etchant.

(S16-4) The protrusions are etched using a mixture (HCl:CH$_3$COOH=1:4) of hydrochloric acid and acetic acid as the etchant.

Through the steps S16-1 to S16-4 above, the protrusions are etched. In the step S16-3, a sulfuric acid-based etchant (H$_2$SO$_4$:H$_2$O$_2$:H$_2$O=5:1:40) may be used. In this wet etching, the depth of etching varies in accordance with the composition and shape of the protrusions. However, the etching stops in the etch stop layer 13 even when the protrusions are most deeply etched. Through this wet etching, each of the protrusions is wet-etched and becomes an opening. Herein, as shown in FIG. 7A, only the insides of the protrusions B1 and B2 are etched, and thus hollow protrusions D1 and D2 are sometimes left. The semiconductor stacked layer 10 around the hollow protrusions D1 and D2 is wet-etched using the insulating layer 41 as a mask, and consequently opening surfaces P$_{Wa}$, P$_{Wb}$, P$_{Wc}$, and P$_{Wd}$ are formed on the major surface of the semiconductor stacked layer 10. However, it is difficult to remove the hollow protrusions D1 and D2 by wet etching.

Therefore, dry etching is performed using the insulating layer 41 as a mask (dry etching step S17). In this dry etching, an etching gas is selected so that the etching rate for an Al-containing III-V group compound semiconductor layer is lower than the etching rate for an InP layer. For example, a gas mixture containing a hydrocarbon (e.g., methane gas: $CH_4$) and hydrogen is used as the etching gas. When the gas mixture containing a hydrocarbon and hydrogen is used as the etching gas, the etching rate for an Al-containing III-V group compound semiconductor layer is lower than the etching rate for an InP layer. This dry etching is performed with, for example, inductively coupled plasma (ICP)-RIE equipment. The processing conditions are as follows. For example, the gas flow ratio is $CH_4:H_2=1:5$, the pressure is 2 Pa, the ICP power is 400 W, and the bias power is 15 W. The sizes of the openings 41c and 41d of the insulating layer 41 are larger than the bottom sizes of the hollow protrusions D1 and D2, respectively. Therefore, the hollow protrusions D1 and D2 and the semiconductor layer 10 around the hollow protrusions D1 and D2 are dry-etched at the same time, and opening surfaces $P_{Da}$, $P_{Db}$, $P_{Dc}$, and $P_{Dd}$ are formed on the major surface of the semiconductor stacked layer 10. As a result, such hollow protrusions are removed as shown in FIG. 7B.

As shown in FIG. 7C, the insulating layer 41 left on the surface of the capping layer 17 is then removed with hydrofluoric acid (insulating layer-removing step (mask layer-removing step) S18). After the insulating layer-removing step S18, the semiconductor mesa portion-forming step S03 to the electrode-forming step S07 shown in FIG. 1 are performed on the semiconductor stacked layer.

As described above, in the above-described method for producing a semiconductor optical device, the semiconductor stacked layer 10 including the etch stop layer 13 and a plurality of semiconductor layers is epitaxially grown on the major surface 11a of the semiconductor substrate 11 in the first epitaxial growth step S01. In the surface treatment step S02, the protrusions A1, A2, B1, and B2 that protrude from the surface of the capping layer 17 are wet-etched, and the hollow protrusions D1 and D2 left after the wet etching are removed by dry etching. According to the method for producing a semiconductor optical device, such protrusions are removed by performing both wet etching and dry etching. Therefore, even if the hollow protrusions D1 and D2 are left after the wet etching, they can be removed by dry etching. In addition, since the etch stop layer 13 is formed, the progress of the wet etching and dry etching can be suppressed in the etch stop layer 13 and thus an excessive amount of etching in the direction of a normal axis NV of the major surface 11a can be suppressed. The etch stop layer 13 is formed below the plurality of semiconductor layers included in the semiconductor stacked layer 10.

The etch stop layer 13 is composed of an Al-containing III-V group compound semiconductor material such as AlInGaAs, AlInAsP, or the like. In the wet etching step S16, a mixture of phosphoric acid and a hydrogen peroxide solution and a mixture of hydrochloric acid and acetic acid are used as etchants for wet etching. Therefore, the progress of the wet etching can be suppressed in the etch stop layer 13, which can suppress an excessive amount of wet etching.

In the dry etching step S17, a gas mixture containing a hydrocarbon and hydrogen is used as the etching gas of the dry etching. The hollow protrusions D1 and D2 can be removed even if a halogen-based etching gas containing chlorine or hydrogen iodide is used. However, when such a halogen-based etching gas is used, the progress of etching cannot be suppressed in an etch stop layer that is composed of an Al-containing III-V group compound semiconductor material. Therefore, an excessive amount of etching may be performed, which may cause patterning defects due to uneven application of a resist in a step performed later. In contrast, when an RIE method that uses a gas mixture containing a hydrocarbon and hydrogen as an etching gas is employed, the etching rate for the etch stop layer 13 can be made lower than the etching rate for an InP layer. Thus, the progress of the dry etching can be suppressed in the etch stop layer 13, and an excessive amount of etching in the direction of a normal axis NV of the major surface 11a can be suppressed.

The etch stop layer 13 has a thickness of about 100 to 500 nm. In the dry etching performed in the dry etching step S17, the difference in etching rate between the etch stop layer 13 and the plurality of semiconductor layers is not large compared with the wet etching performed in the wet etching step S16. Therefore, the progress of the dry etching cannot be completely stopped in the etch stop layer 13. Furthermore, if a thick etch stop layer 13 is formed, the number of protrusions may be increased. By setting the thickness of the etch stop layer 13 to about 100 to 500 nm, an increase in the number of protrusions can be suppressed and a layer below the etch stop layer 13 can be prevented from being dry-etched.

The insulating layer 41 has a thickness of about 200 to 500 nm. The insulating layer 41 is actually etched by the dry etching performed in the dry etching step S17. Therefore, if the insulating layer 41 is eliminated by etching, the semiconductor stacked layer 10 is etched. By adjusting the thickness of the insulating layer 41 in the insulating layer-forming step S11, the sizes of the openings 41a, 41b, 41c, and 41d may be adjusted so that the semiconductor stacked layer 10 is not excessively etched with hydrofluoric acid in the insulating layer selectively removing step S14. When the insulating layer 41 has a thickness of about 200 to 500 nm, an excessive amount of etching of the semiconductor stacked layer 10 can be suppressed in the insulating layer selectively removing step S14 and a layer below the insulating layer 41 can be prevented from being dry-etched in the dry etching step S17.

In the above-described method for producing a semiconductor optical device, portions of the insulating layer 41 formed on the tip portions and side surfaces of the protrusions A1, A2, B1, and B2 are removed in the insulating layer selectively removing step S14 so that the sizes of the openings 41a, 41b, 41c, and 41d of the insulating layer 41 are larger than the bottom sizes of the protrusions A1, A2, B1, and B2, respectively. Thus, when the dry etching is performed using a gas mixture containing a hydrocarbon and hydrogen as the etching gas, the capping layer 17 exposed through the openings 41a, 41b, 41c, and 41d of the insulating layer 41 and the semiconductor layers formed below the capping layer 17 can be etched together with the hollow protrusions D1 and D2. Therefore, the hollow protrusions D1 and D2 left after the wet etching can be removed together with the semiconductor layers around the hollow protrusions D1 and D2. Accordingly, the hollow protrusions D1 and D2 can be removed with certainty without depending on direct etching of the hollow protrusions D1 and D2 by dry etching.

The method for producing a semiconductor optical device according to the present invention is not limited to the embodiment above. For example, in the embodiment above, the surface treatment step S02 is performed after the first epitaxial growth step S01, but the same surface treatment step may be further performed after the third epitaxial growth step S05. The etch stop layer 13 is not necessarily formed between the buffer layer 12 and the lower cladding layer 14, and may be formed at a position according to the depth at which etching is allowed.

Principles of the present invention have been described on the basis of preferred embodiments with reference to the drawings. However, those skilled in the art will understand that the embodiments can be changed in terms of details without departing from the principles. Therefore, all the modifications and changes within the scope and the spirit of Claims are claimed as the present invention.

What is claimed is:

1. A method for producing a semiconductor optical device comprising the steps of:
    growing a semiconductor stacked layer including an etch stop layer and a plurality of semiconductor layers on a major surface of a substrate;
    forming a mask layer on a top surface of the semiconductor stacked layer so that a tip portion of each protrusion generated in the step of growing the semiconductor stacked layer is exposed at the top surface;
    etching each protrusion by wet etching using the mask layer;
    after etching each protrusion by wet etching, removing the protrusion by dry etching; and
    removing the mask layer from the top surface, after removing each protrusion by dry etching,
    wherein the step of forming the mask layer includes the steps of:
    forming an insulating layer on the tip portion and a side surface of each protrusion and on the top surface of the semiconductor stacked layer;
    forming a resist layer by applying a resist on the insulating layer so that the tip portion of each protrusion is exposed; and
    selectively removing the insulating layer from the tip portion and side surface of each protrusion using the resist layer, said step of selectively removing the insulating layer including over-etching the insulating layer below the resist layer at the periphery of each protrusion to form an opening in the insulating layer around each protrusion with the size of the formed opening being larger than a size of the bottom of the protrusion.

2. The method according to claim 1, wherein the step of forming the mask layer further includes a step of descumming the resist formed on the tip portion and side surface of each protrusion, after forming the resist layer.

3. The method according to claim 1, wherein the etch stop layer is composed of an Al-containing III-V group compound semiconductor material.

4. The method according to claim 1, wherein in the step of etching the protrusion by wet etching, the wet etching is performed using an etchant that is a mixture containing at least one of phosphoric acid, a hydrogen peroxide solution, hydrochloric acid, and acetic acid.

5. The method according to claim 1, wherein in the step of removing the protrusion by dry etching, the dry etching is performed by a reactive ion etching method using a gas mixture containing a hydrocarbon and hydrogen as an etching gas.

6. The method according to claim 1, wherein the mask layer has a thickness of 200 to 500 nm.

7. The method according to claim 1, wherein the etch stop layer has a thickness of 100 to 500 nm.

8. The method according to claim 1, wherein:
    the etch stop layer is composed of an Al-containing III-V group compound semiconductor material,
    the plurality of semiconductor layers are disposed on the etch stop layer and include a semiconductor layer composed of InP of an n-type or a p-type,
    in the step of etching each protrusion by wet etching, a mixture of phosphoric acid and a hydrogen peroxide solution, or a mixture of hydrochloric acid and acetic acid is used as an etchant, and
    in the step of removing each protrusion by dry etching, a gas mixture containing a hydrocarbon and hydrogen is used as an etching gas.

* * * * *